United States Patent [19]

Marino et al.

[11] 4,423,378

[45] Dec. 27, 1983

[54] AUTOMOTIVE BATTERY TEST APPARATUS

[75] Inventors: Joseph A. Marino, Waukesha, Wis.; Sydney J. Roth, Largo, Fla.

[73] Assignee: Bear Automotive Service Equipment Company, Milwaukee, Wis.

[21] Appl. No.: 327,586

[22] Filed: Dec. 4, 1981

[51] Int. Cl.³ .......................................... G01N 27/46
[52] U.S. Cl. ..................................... 324/427; 324/429; 324/430; 324/431; 324/433; 340/636; 320/48
[58] Field of Search ........................ 324/427, 429–431, 324/433, 436; 320/48; 340/636

[56] References Cited

U.S. PATENT DOCUMENTS

| | | | |
|---|---|---|---|
| 3,753,094 | 8/1973 | Furuishi et al. | 324/430 |
| 3,873,911 | 3/1975 | Champlin | 324/430 |
| 4,193,025 | 3/1980 | Frailing et al. | 324/430 |
| 4,322,685 | 3/1982 | Frailing et al. | 324/429 |

*Primary Examiner*—Michael J. Tokar
*Assistant Examiner*—Kevin D. O'Shea
*Attorney, Agent, or Firm*—Kinney, Lange, Braddock, Westman and Fairbairn

[57] ABSTRACT

The condition of a storage battery of an internal combustion engine powered vehicle is tested automatically, and an indication of battery condition is provided to the service technician. The battery testing apparatus is connected to the positive (+) and negative (−) terminals of the battery to measure battery voltage under several different conditions. In particular, the battery testing apparatus measures battery voltage under open circuit conditions, while subjecting the battery to a predetermined AC load, and while subjecting the battery to a predetermined DC load. The battery testing apparatus also includes a temperature probe which measures the temperature of the battery. A digital computer control utilizes the measured open circuit voltage, the measured voltage under a predetermined DC load, and the measured voltage under an AC load (which represents dynamic internal resistance of the battery) and the temperature measurement to provide an indication of battery condition based upon these measured parameters and stored data for normal characteristics of the battery under test.

12 Claims, 5 Drawing Figures

AUTOMOTIVE BATTERY TEST APPARATUS

BACKGROUND OF THE INVENTION

1. Field of the Invention

The present invention relates to apparatus for automatically testing components of an internal combustion engine powered vehicle. In particular, the present invention is related to battery testing apparatus for testing the condition of a storage battery of the vehicle.

2. Description of the Prior Art

In a typical internal combustion engine powered vehicle, a six or twelve volt DC storage battery is used to provide a source of electrical power to the engine ignition system, the engine starter system, and other components of the vehicle. The storage battery normally encounters heavy current draw while powering the starter system which starts the internal combustion engine, and receives charging current from the generator or alternator of the vehicle while the engine is running. Typically the generator or alternator is powered through a belt drive from the internal combustion engine.

The condition of the storage battery is an important factor in proper performance of the vehicle. If the storage battery has a defective cell, or is no longer able to hold a full charge, it may not be able to provide the heavy cranking current necessary to operate the starter system and start the vehicle.

In the past, battery testing apparatus has been developed to perform tests on the storage battery of an automobile to determine whether the battery is beginning to fail. In many cases, this apparatus has required several different sets of leads to be alternately connected and removed from the battery, and has required a number of steps to be performed by the service technician. There is a continuing need for improved battery testing apparatus which is simple to use, which provides an accurate indication of whether the storage battery is about to fail, and is simple for the service technician to use.

SUMMARY OF THE INVENTION

The present invention is a battery testing apparatus which provides an indication of the condition of the storage battery of an internal combustion engine powered vehicle. The battery testing apparatus includes means connected to the positive (+) and negative (−) terminals of the battery for measuring dynamic internal resistance of the battery. In addition, the battery testing apparatus includes means connected to the + and − terminals for measuring open circuit voltage of the battery, and means connected to the + and − terminals of the battery for measuring voltage of the battery with a predetermined DC load connected across the + − terminals. Temperature measuring means is also included in the battery testing apparatus for measuring temperature of the battery. Based upon the measured dynamic internal resistance, the measured open circuit voltage, the measured voltage with a predetermined DC load, and the measured temperature, the battery testing apparatus provides an indication of battery condition.

In preferred embodiments of the present invention, the battery testing apparatus includes digital data storage means for storing characteristics of each of a plurality of different storage batteries which may be tested. In providing the indication of battery condition, the battery testing apparatus uses the stored characteristics of the particular battery under test, together with the measured parameters.

DETAILED DESCRIPTION OF THE PREFERRED EMBODIMENTS

Figure 1:
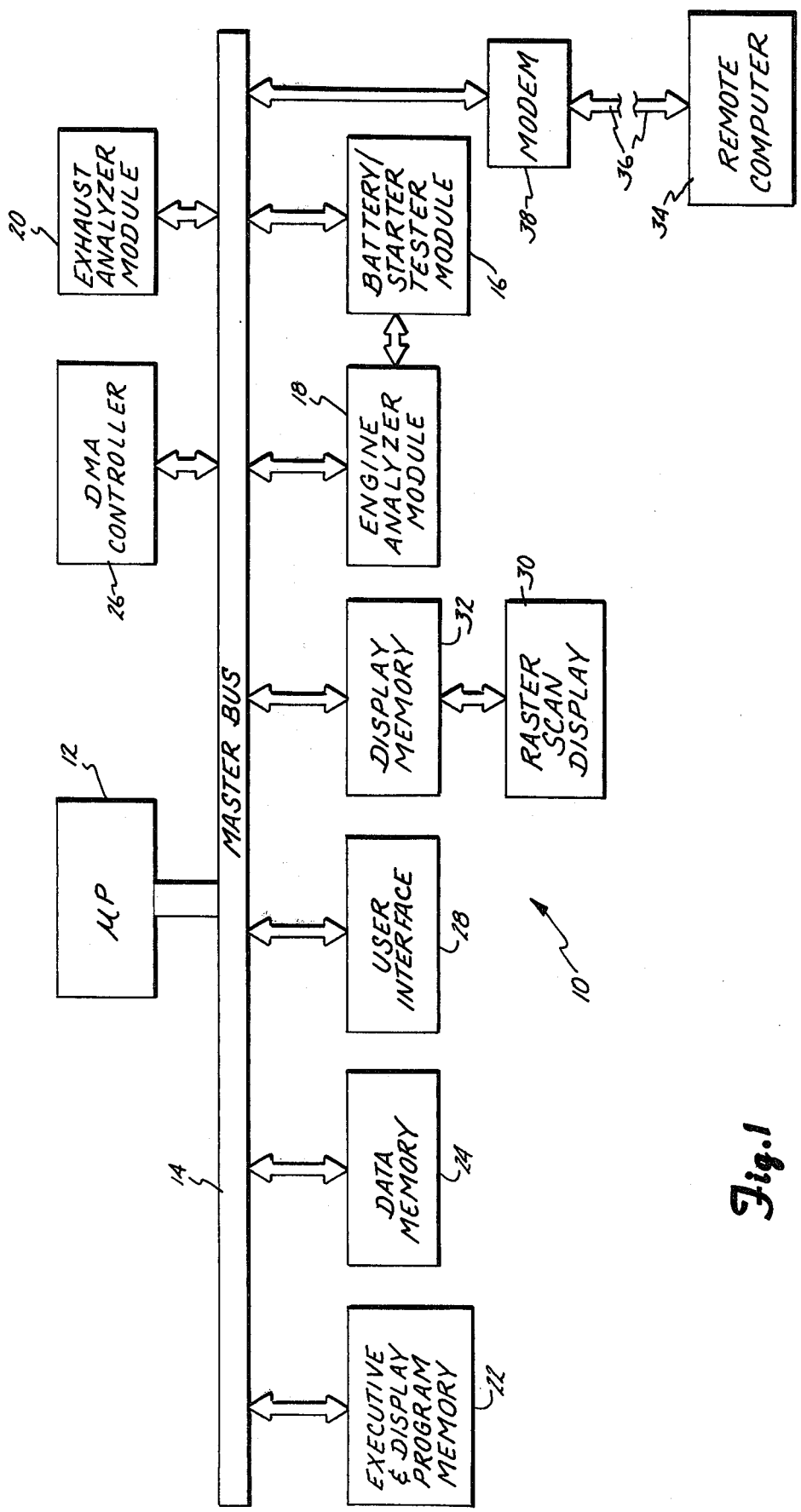
FIG. 1 is a block diagram of an engine analyzer which includes the battery testing apparatus of the present invention.

As shown in FIG. 1, the battery testing apparatus of the present invention is preferably a part of a computerized engine analyzer 10. Overall operation of engine analyzer 10 is controlled by microprocessor 12, which communicates with the various subsystems of engine analyzer 10 by means of master bus 14. In the preferred embodiments of the present invention, master bus 14 is made up of fifty-six lines, which form a data bus, an address bus, a control bus, and a power bus.

The particular embodiment shown in FIG. 1 includes battery/starter tester module 16, engine analyzer module 18, and exhaust analyzer module 20, which perform tests on various components and subsystems of a vehicle to be tested. Battery/starter tester module 16 includes the battery testing apparatus forming a part of the present invention, and will be described in further detail in FIGS. 2-5. Engine analyzer module 18 primarily performs ignition system testing of the vehicle, and exhaust analyzer module 20 performs exhaust gas analysis. Neither of these latter two modules 18 and 20 forms a part of the battery testing apparatus of the present invention, and will not be described in further detail in this specification.

Control of engine analyzer system 10 by microprocessor 12 is based upon a stored program in the particular test module 16, 18 or 20 being used, together with a stored program in executive and display program memory 22. Digital data obtained during test operation is stored in data memory 24. In certain cases, the data generated by the particular module 16, 18 or 20 is in the form of digitized waveforms. Rather than burden microprocessor 12 with the transfer of this digital data to data memory 24, direct memory access (DMA) controller 26 handles this data transfer.

Interaction with the service technician or operator is provided through user interface 28 and raster scan display 30. User interface 28 interfaces with master bus 14, and preferably includes control switches and a keyboard (not shown) through which the service technician or operator can enter data and select particular tests to be performed.

Raster scan display 30 is controlled by microprocessor 12 through display memory 32. Microprocessor 12 supplies display control signals to display memory 32, which are used to control raster scan display 30. The information displayed on raster scan display 30 preferably includes prompting messages, numerical data, waveforms, and other information usable by the operator in selecting tests to be performed and in visually inspecting the results of the tests that are performed.

An important advantage of the engine analyzer 10 illustrated in FIG. 1 is the capability of expansion to perform other test functions. This can be achieved by adding additional test modules which interface with master bus 14. In addition, engine analyzer 10 has the ability to communicate with remote computer 34 by means of communication link 36 and modulator/demodulator (MODEM) 38. This is a particularly advantageous feature, since remote computer 34 typically has greater data storage and computational capabilities than are present within engine analyzer 10. MODEM 38 permits digital data stored in data memory 24 to be transferred to remote computer 34 for further analysis, and also permits remote computer 34 to provide test parameters and other control information to microprocessor 12 for use in testing.

Figure 2:
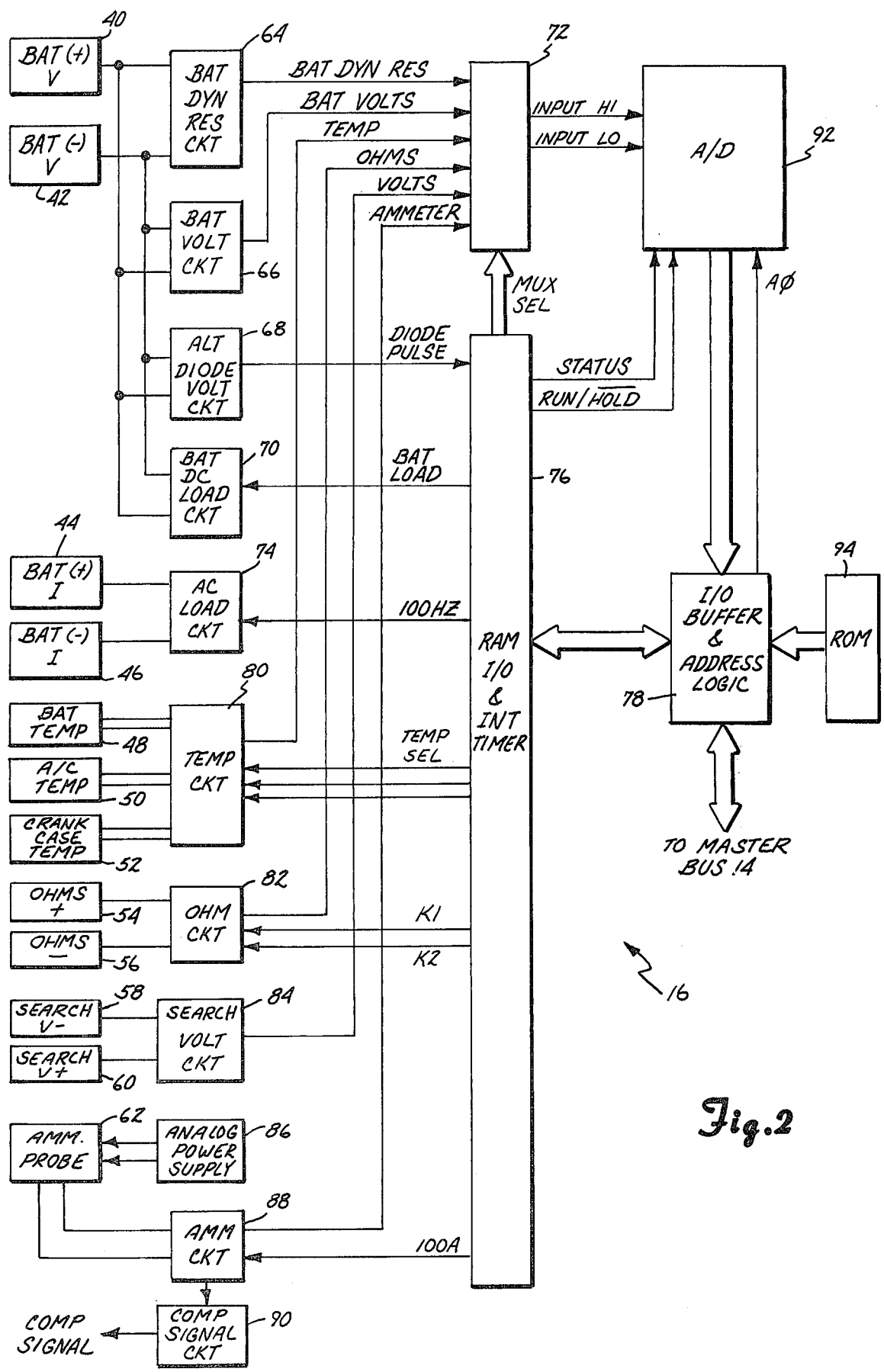
FIG. 2 is an electrical block diagram of the battery test module of the engine analyzer of FIG. 1.

FIG. 2 shows battery starter tester module 16. As shown in FIG. 2, battery starter tester module 14 includes a pair of battery voltage clamps (BAT (+) V clamp 40 and BAT (−) V clamp 42), a pair of battery current clamps (BAT (+) I clamp 44 and BAT (−) I clamp 46), battery temperature probe 48, air conditioning coil temperature probe 50, crankcase oil temperature probe 52, ohms (+) lead 54, ohms (−) lead 56, search V (−) lead 58, search V (+) lead 60, and ammeter probe 62.

Connected to BAT (+) V clamp 40 and BAT (−) V clamp 42 are battery dynamic resistance circuit 64, battery voltage circuit 66, alternator diode voltage circuit 68, and battery DC load circuit 70. Battery dynamic resistance circuit 64 provides a BAT DYN RES signal to analog multiplexer 72 which represents measured dynamic internal resistance of the battery (not shown) connected to clamps 40 and 42. As will be discussed in further detail later, the BAT DYN RES signal is monitored in conjunction with operation of AC load circuit 74, which is connected to BAT (+) I and BAT (−) I clamps 44 and 46. To facilitate easy use of clamps 40, 42, 44 and 46, the two positive clamps (40 and 44) are preferably attached at the end of one multiconductor cable, while the two negative clamps (42 and 46) are attached at the end of a second multiconductor cable.

Battery voltage circuit 66 provides a BAT VOLTS signal to analog multiplexer 72. The BAT VOLTS signal represents DC voltage between clamps 40 and 42. This signal is used when measuring open circuit voltage and in measuring battery voltage when the battery is subjected to a DC load by battery DC load circuit 70.

Alternator diode voltage circuit 68 provides a DIODE PULSE signal which includes a pulse for each diode ripple pulse present at clamps 40 and 42. The DIODE PULSE signal is supplied to integrated circuit 76, which in the preferred embodiment of the present invention is an R6532 random access memory (RAM), input/output (I/O) and interval timer chip.

When battery voltage under a DC load condition is to be measured, microprocessor 12 causes chip 76 to supply a BAT LOAD signal to battery DC load circuit 70. This signal causes battery DC load circuit 70 to connect a predetermined resistance between clamps 40 and 42 so as to present a predetermined DC load between the + and − terminals of the battery connected to clamps 40 and 42, respectively.

AC load circuit 74 is controlled by microprocessor 12 through I/O buffer and address logic 78 and chip 76 to selectively provide a known AC load between the + and − terminals of the battery connected to clamps 44 and 46. This known AC load is used in conjunction with battery dynamic resistance circuit 64 to provide a measurement of the dynamic internal resistance of the battery. In the embodiments shown in FIG. 2, AC load circuit 74 selectively receives a 100 Hz drive signal from chip 76, and in turn provides a 100 Hz, 100 mA current signal to the battery through clamps 44 and 46.

Temperature circuit 80 is connected to temperature probes 48, 50 and 52, and provides an ANALOG TEMP signal to analog multiplexer 72 which represents temperature sensed by one of the probes 48, 50 or 52. The particular probe whose output is supplied through temperature circuit 80 to multiplexer 72 is selected by the TEMP SEL signal supplied by chip 76 under the control of microprocessor 12.

Ohms circuit 82 is connected to ohms (+) lead 54 and ohms (−) lead 56, and provides to multiplexer 72 an OHMS signal, which is a voltage proportional to the resistance between leads 54 and 56. Ohms circuit 82 permits measurement of resistance in three different ranges, which are selectable by the K1 and K2 signals supplied by chip 76 under the control of microprocessor 12.

The search voltage circuit 84 is connected to Search V− lead 58 and Search V+ lead 60. Search voltage circuit 84 is a high impedance voltmeter circuit which provides to multiplexer 72 a VOLTS signal, which represents the voltage between leads 58 and 60.

Analog power supply 86 supplies current to ammeter probe 62. The output of ammeter probe 62 is supplied to ammeter circuit 88, where it is amplified by ammeter 88 and is supplied as an AMMETER signal to multiplexer 72. In the embodiment shown in FIG. 2, chip 76 (under the control of microprocessor 12) supplies ammeter circuit 88 with a 100A signal, which controls a gain resistor within ammeter circuit 88. This allows further amplification of the AMMETER signal if the current level is under 100 amps.

Ammeter circuit 88 also supplies an output signal to compression signal circuit 90. The signal from ammeter circuit 88 is amplified by compression signal circuit 90 and is converted to an absolute value compression signal which is supplied to engine analyzer module 18 shown in FIG. 1. This signal is used to measure starter cranking current. In this particular embodiment, the compression signal is supplied to engine analyzer module 18 where it is digitized and supplied to data memory 24.

Battery starter tester module 16 shown in FIG. 2 also includes analog-to-digital (A/D) converter 92 and read only memory (ROM) 94. A/D converter 92 receives INPUT HI and INPUT LO output lines from analog multiplexer 72. The particular analog signal supplied by multiplexer 72 to A/D converter 92 is controlled by MULTIPLEX SELECT signals from chip 76 under control of microprocessor 12.

In the preferred embodiment of the present invention, A/D converter 92 is a 7109 integrated circuit, dual slope, twelve-bit analog-to-digital converter which operates slightly below thirty conversions per second. A/D converter 92 provides its converted digital output to microprocessor 12 through I/O buffer and address logic 78.

Control of A/D converter 92 by microprocessor 12 is provided through integrated circuit chip 76 by means of STATUS and RUN/HOLD signals, and by address line A∅ from I/O buffer and address logic 78. Since twelve bits of data are supplied by A/D converter 92 while master bus 14 has only eight data lines, the data from A/D converter 92 is supplied in two bytes. When address line A∅ from logic 76 goes low, the first eight data bits are transferred from A/D converter 92 through logic 78 to master bus 24. When address line A∅ goes high, the next four high order data bits are supplied. In addition, another bit of the second byte indicates an over-range condition (all bits high) is occurring and still another bit indicates analog input voltage polarity.

ROM 94 is, in one preferred embodiment, a pair of 2K×8 electrically programmable read only memories which store the program necessary for execution and testing of all battery parameters. The memory is fixed and non-volatile. If the test program requires a change, ROM 94 is removed and modified or replaced.

Integrated circuit chip 76 allows control by microprocessor 12 of the various circuits of battery/starter tester module 16, so that a selected test sequence can be performed. Microprocessor 12 causes chip 76 to provide the MULTIPLEX SELECT signal to multiplexer 72 which will select the desired signal channel to be supplied to A/D converter 92. Under control of microprocessor 12, chip 76 generates the 100 Hz square wave signal to activate AC load circuit 74. The alternator DIODE PULSE signal from alternator diode voltage circuit 78 is received by chip 76 and supplied to microprocessor 12. The DIODE PULSE signal is interpreted by microprocessor 12 according to the stored program in ROM 94 so as to give an indication of diode condition and an indication of whether fan belt slippage is occurring. Microprocessor 12 also controls chip 76 to provide the BAT LOAD signal to battery DC load circuit 70. This initiates actuation of the high current DC battery load during battery testing and maintains this DC load for a fixed programmed interval which is timed by chip 76. Finally, microprocessor 12 controls selection of the particular temperature probe 48, 50 or 52 and selection of ohmmeter range through chip 76.

The apparatus of the present invention performs an automated battery test procedure by measuring dynamic internal resistance of the battery under an AC load condition, measuring battery operating voltage under open circuit conditions, measuring battery temperature, and measuring battery operating voltage under direct current (DC) load condition. These tests are performed by use of clamps 40, 42, 44 and 46 and battery temperature probe 48, and utilize battery dynamic resistance circuit 64, battery voltage circuit 66, battery DC load circuit 70, AC load circuit 74, and temperature circuit 80, together with multiplexer 72, integrated circuit chip 76, I/O buffer and address logic 78, A/D converter 92, and ROM 94. The following discussion, therefore, will deal only with these portions of module 16, and further discussion of the remaining circuits shown in FIG. 2 will not be contained in this specification.

In determining battery condition in accordance with the present invention, microprocessor 12 first measures dynamic resistance Rd of the battery by means of AC load circuit 74 and battery dynamic resistance circuit 64. The 100 Hz signal is supplied to AC load circuit 74, which causes a 100 Hz, 100 milliamp signal to be supplied to the battery terminals. Battery dynamic resistance circuit 64 measures the AC voltage produced as a result of this AC load, and supplies an analog signal (BAT DYN RES) through multiplexer 72 to A/D converter 92. The resulting digital signal represents dynamic internal resistance of the battery. If the dynamic internal resistance is 20 milliohms or greater, this indicates the need for recharging or replacement of the battery. In this case, microprocessor 12 provides a message to the service technician or operator through rastor scan display 30, and the test need not proceed further.

Next, the open circuit battery voltage is measured by battery voltage circuit 66. This open circuit voltage is corrected for temperature by use of the TEMP signal supplied from battery temperature probe 48 through temperature circuit 80 to multiplexer 72.

Microprocessor 12 then uses the corrected open circuit voltage Voc and the dynamic internal resistance Rd to determine maximum power transfer Pd. This calculation is based upon the following relationship:

$$Pd = Voc^2/4Rd \qquad \text{Equation No. 1}$$

Based upon this information, microprocessor 12 can then determine the power of the battery at $P_{100\%}$. Based on test measurements which have batteries of various sizes at various states of charge, and at different temperatures, the following relationship has been determined:

$$P_{100\%} = \left(\frac{12.6\ (T\ \text{in}\ °F.)}{Voc}\right)^2 \times Pd \qquad \text{Equation No. 2}$$

This calculated value of $P_{100\%}$ yields a value which correlates to battery size.

Microprocessor 12 then causes battery DC load circuit 70 to connect a fixed DC load (i.e. a fixed resistance) to the battery through clamps 40 and 42. Fifteen seconds after the DC load has been applied, microprocessor 12 causes the BAT VOLTS signal from battery voltage circuit 66 to be read and converted to a digital voltage reading. This battery voltage reading is then corrected by microprocessor 12 for temperature based on the previously sensed battery temperature.

Stored in ROM 94 is a 75% state-of-charge curve for various ampere hour size batteries. Based upon the battery size value determined from $P_{100\%}$, microprocessor 12 is able to determine the 75% state-of-charge point on the curve corresponding to the particular battery under test. The measured voltage under DC load is compared to this 75% state-of-charge voltage. If the voltage under DC load is greater than the voltage point from the 75% state-of-charge curve, the battery is acceptable. A voltage reading which is below the voltage point 75% state-of-charge curve for the particular battery size indicates a defective battery. Depending upon this determination, microprocessor 12 provides a visual indication to the operator through raster scan display 30 of whether the battery is acceptable or defective.

The battery test apparatus of the present invention, under the control of microprocessor 12, also preferably provides an indication of whether the battery is adequate for the particular vehicle in which it is installed. The service technician enters the engine size through user interface 28 when requesting battery tests. This engine size is stored in data memory 24. When microprocessor 12 determines battery size in amp hours by means of $P_{100\%}$, microprocessor 12 can compare the determined amp hour range with the amp hour range which is required for the particular engine size. In general, an engine having a displacement of less than 300 cubic inch needs a battery in the 35 to 50 amp hour range, while engines having displacement of greater than 300 cubic inch require batteries in the 50 to 80 amp hour range. If microprocessor 12 determines that the amp hour range of the battery under test falls below the amp hour range required by the particular engine size entered through user interface 28, microprocessor 12 provides a warning message to the service technician through raster scan display 30.

Figure 3:
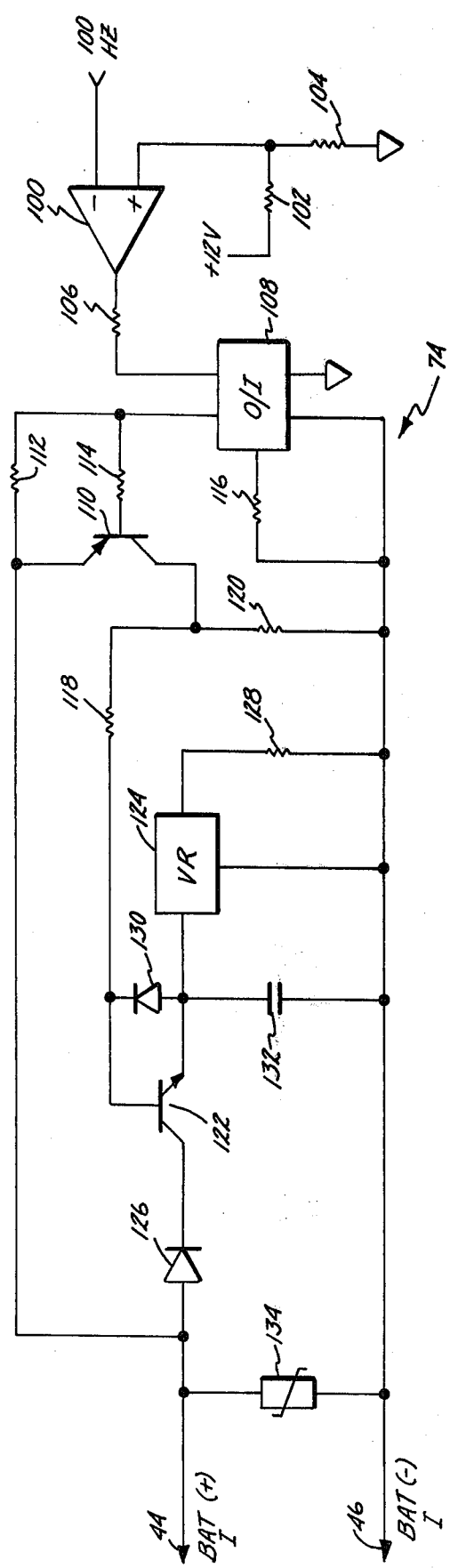
FIG. 3 is an electrical schematic diagram of the AC load circuit of the battery test module of FIG. 2 used in providing a known AC load for testing battery dynamic internal resistance.
Figure 4:
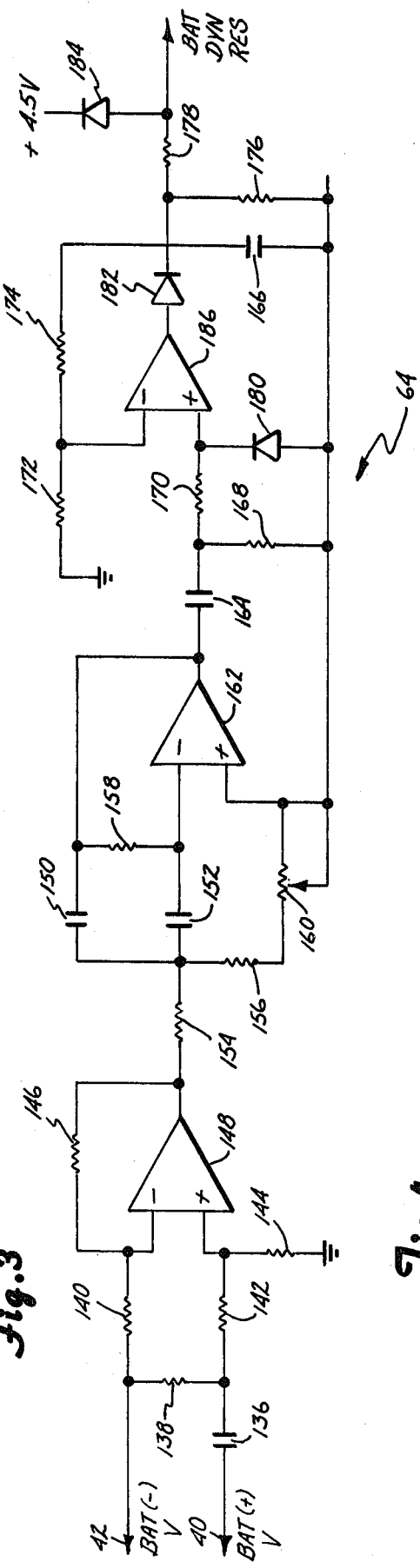
FIG. 4 is an electrical schematic diagram of a battery dynamic resistance circuit of the battery test module of FIG. 2 used in conjunction with the circuit of FIG. 3 to measure battery dynamic internal resistance.
Figure 5:
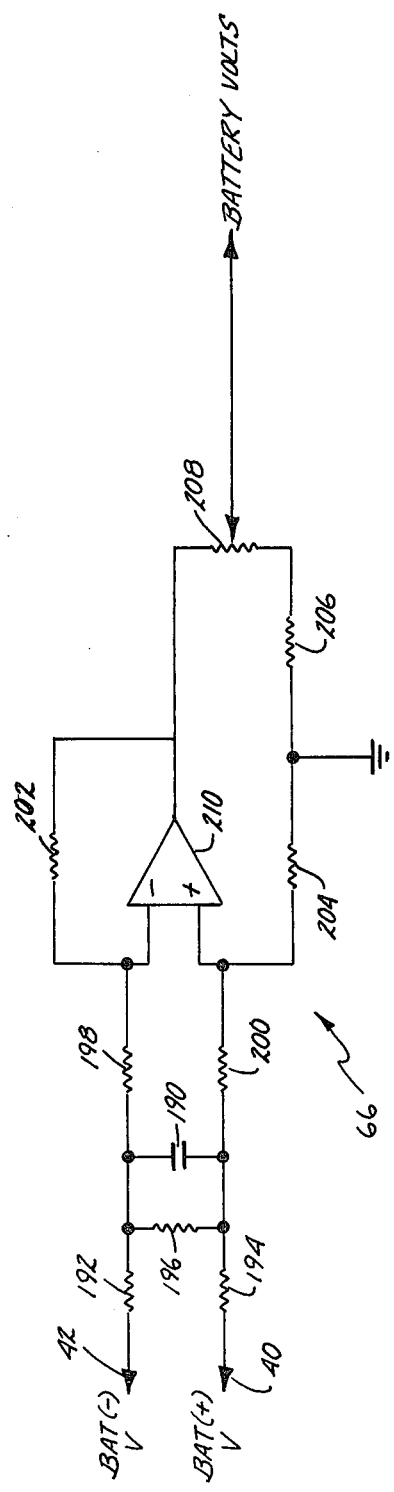
FIG. 5 is a battery voltage measuring circuit of the battery test module of FIG. 2 which is used to measure battery voltage under open circuit conditions and battery voltage with the battery under a predetermined DC load.

FIGS. 3, 4 and 5 are electrical schematic diagrams showing in further detail AC load circuit 74, battery dynamic resistance circuit 64, and battery voltage circuit 66, respectively. As described above, AC load circuit 74 of FIG. 3 and battery dynamic resistance circuit 64 of FIG. 4 are used in conjunction with one another in measurement of battery dynamic internal resistance. Battery voltage circuit 66 shown in FIG. 5 is used in measurement of both open circuit battery voltage and battery voltage under a DC load.

As shown in FIG. 3, the 100 Hz signal generated by integrated circuit chip 76 is amplified by an amplifier circuit which includes operational amplifier 100 and resistors 102 and 104. The amplified 100 Hz signal is supplied through resistor 106 to opto-isolator 108. The output of opto-isolator 108 is amplified by a circuit including PNP transistor 110 and resistors 112, 114, 116, 118 and 120. When transistor 110 is turned on, it provides current flow from BAT (+) I clamp 44 through the emitter/collector current path of transistor 110, through resistor 118, to the base of PNP transistor 122. This turns on transistor 122, which in turn turns on voltage regulator 124. This provides a constant 100 milliamp current flow from BAT (+) I clamp 44, through diode 126, the collector/emitter current path of transistor 122 to the input of voltage regulator 124 and from the output of voltage regulator 124 through resistor 128 to BAT (−) I clamp 46. As shown in FIG. 3, circuit 72 also inclucdes protective diode 130 connected between emitter and base of transistor 122, capacitor 132, and varistor 134.

AC load circuit 74 provides a 100 Hz, 100 milliamp square wave current signal which develops an AC voltage across the internal resistance of the battery. This AC voltage is sensed by battery dynamic resistance circuit 64.

As shown in FIG. 4, battery dynamic resistance circuit 64 includes a first AC amplification stage connected to BAT (−) V clamp 42 and BAT (+) V clamp 40. The first amplification stage includes capacitor 136, resistors 138, 140, 142, 144 and 146 and operational amplifier 148.

The amplified AC signal from the first amplification stage is supplied to a second amplification stage which includes a tuned 100 Hz filter. The second amplification stage and tuned filter includes capacitors 150 and 152, resistors 154, 156 and 158, potentiometer 160 and operational amplifier 162.

In the third and final amplification stage, the filtered AC signal is AC coupled, filtered and rectified to produce an output DC voltage level (BAT DYN RES) which is directly proportional to the dynamic internal resistance of the battery under test. The lower the voltage level, the lower the internal battery resistance, thus indicating higher output capability of the battery. The final amplification stage includes capacitors 164 and 166, resistors 168, 170, 172, 174, 176 and 178, diodes 180, 182 and 184, and operational amplifier 186.

In operation, microprocessor 12 activates chip 76 to provide the 100 Hz drive signal to AC load circuit 74. This causes the 100 Hz, 100 milliamp square wave circuit to be applied to the battery through clamps 44 and 46. At the same time, the output signal from battery dynamic resistance circuit 64 is supplied through multiplexer 72 to A/D converter 92, and then through I/O buffer and address logic 78 to master bus 14. Microprocessor 12 causes chip 76 to supply the appropriate MULTIPLEX SELECT signal to multiplexer 72, so that the BAT DYN RES signal is supplied by multiplexer 72 to A/D converter 92.

FIG. 5 shows battery voltage circuit 66, which is used to measure both open circuit voltage and battery voltage under a DC load. As illustrated in FIG. 5, battery voltage circuit 66 is preferably a single DC amplification stage connected to BAT (−) V clamp 42 and BAT (+) V clamp 40. Circuit 66 includes capacitor 190, resistors 192, 194, 196, 198, 200, 202, 204 and 206, potentiometer 208, and operational amplifier 210.

Battery DC load circuit 70, which is energized by the BAT LOAD signal from chip 76, preferably includes a fixed resistance and solenoid relay contacts (not shown) connected in series between clamps 40 and 42. When the BAT LOAD signal is low, the solenoid is deenergized, the relay contacts are open, and battery DC load circuit 70 is simply an open circuit. When the BAT LOAD signal is high, the solenoid is energized, thus closing the relay contacts and connecting the fixed DC resistance between clamps 40 and 42. This presents a DC load of known resistance between the + and − terminals of the battery under test.

Battery temperature probe 48 and temperature circuit 80 can take any one of several known forms for sensing temperature and providing an analog voltage representative of temperature. In one preferred embodiment, battery temperature probe 48 is a resistive type temperature sensor, and temperature circuit 80 includes a resistive bridge into which temperature probe 48 is connected when the appropriate TEMP SEL signal is present, together with at least one stage of amplification of the analog voltage from the bridge.

In conclusion, the battery test apparatus of the present invention provides rapid and simple testing of a battery of an internal combustion engine powered vehicle which provides a highly accurate and reliable indication to the service technician of the condition of the battery. All of the test steps performed can be performed individually, or as a programmed sequence of tests under the control of microprocessor 12. In either case, prompting messages and visual indication of battery conditions are provided to the operator by microprocessor 12 through raster scan display 30.

Although the present invention has been described with reference to preferred embodiments, workers skilled in the art will recognize that changes may be made in form and detail without departing from the spirit and scope of the invention.

What is claimed is:

1. A battery test apparatus for testing conditions of a storage battery of an internal combustion engine powered vehicle, the battery testing apparatus comprising:

connection means for connecting the battery test apparatus to positive (+) and negative (−) terminals of the battery;
means connected to the connection means for providing a first electrical signal representative of measured dynamic internal resistance of the battery;
means connected to the connection means for providing a second electrical signal representative of measured open circuit voltage of the battery;
means connected to the connection means for providing a third electrical signal representative of measured voltage of the battery with a predetermined DC load connected between the + and − terminals;
means for providing a fourth electrical signal representative of measured temperature of the battery;
means for deriving a value Rd representative of dynamic internal resistance of the battery based upon the first signal;
means for deriving a valve Voc representative of temperature corrected open circuit voltage from the second and fourth signals;
means for deriving a value Pd representative of maximum power transfer from the battery based upon Voc and Rd;
means for deriving a value T representative of temperature of the battery from the fourth signal;
means for deriving a value $P_{100\%}$ representative of power rating of the battery at 100% state-of-charge from the values T, Pd and Voc;
means for determining a battery rating of the battery based upon $P_{100\%}$;
means for deriving a reference value as a function of the battery rating which represents a predetermined state-of-charge which is less than 100%;
means for deriving a temperature corrected measured voltage value under DC load conditions from the third and fourth signals;
means for comparing the temperature corrected measured value with the reference voltage value; and
means for providing an indication of battery condition based upon the comparison.

2. The battery test apparatus of claim 1 wherein the means for providing a first electrical signal comprises:
means connected to the connection means for providing an AC current signal to the + and − terminals of the battery; and
means connected to the connection means for providing the first electrical signal representative of dynamic internal resistance of the battery while the AC current signal is provided.

3. The battery test apparatus of claim 2 wherein the AC current signal has a predetermined frequency and amplitude.

4. The battery test apparatus of claim 3 wherein the means for providing the first electrical signal representative of dynamic internal resistance to the battery while the AC current signal is provided comprises:
means for deriving from the + and − terminals an AC voltage signal which is a function of the dynamic internal resistance of the battery;
means for filtering the AC voltage signal to remove frequencies other than the predetermined frequency; and
means for converting the filtered AC voltage signal to the first electrical signal, which is a DC voltage signal proportional to the dynamic internal resistance of the battery.

5. The battery test apparatus of claim 4 wherein the means for deriving includes an AC amplifier.

6. The battery test apparatus of claim 1 and further comprising:
means for providing an indication of need for recharging or replacement of the battery if the value Rd is less than a predetermined value.

7. The battery test apparatus of claim 1 wherein the means for deriving the value Pd calculates Pd based upon the following relationship:

$$Pd = (Voc^2/4Rd)$$

8. The battery test apparatus of claim 1 wherein the means for deriving the value $P_{100\%}$ calculates $P_{100\%}$ based upon the following relationship:

$$P_{100\%} = \left( \frac{12.6 \, (T \text{ in } °F.)}{Voc} \right)^2 \times Pd$$

9. A method of testing a storage battery of an internal combustion engine powered vehicle, the method comprising:
measuring dynamic internal resistance of the battery;
measuring open circuit voltage of the battery;
deriving a maximum power transfer of the battery based upon the measured dynamic internal resistance and the measured open circuit voltage;
deriving a power rating of the battery at 100% state-of-charge based upon the measured open circuit voltage and the maximum power transfer;
determining a battery rating of the battery based upon the power rating of the battery at 100% state-of-charge;
measuring voltage of the battery under a predetermined DC load;
comparing the measured voltage under a predetermined DC load with a voltage value corresponding to the determined battery rating and representative of a predetermined state-of-charge which is less than 100%; and
providing an indication of condition of the battery based upon the comparing.

10. The method of claim 9 and further comprising:
measuring temperature of the battery; and
correcting the measured open circuit voltage and the measured voltage under a predetermined DC load as a function of the measured temperature.

11. The method of claim 9 and further comprising:
providing an indication of need for recharging or replacement of the battery if the measured dynamic internal resistance is smaller than a predetermined value.

12. A battery test apparatus for testing a storage battery having positive (+) and negative (−) terminals, the battery testing apparatus comprising:
means for connecting the battery test apparatus to the + and − terminals of the battery;
means for measuring dynamic internal resistance of the battery;
means for measuring open circuit voltage of the battery;
means for measuring voltage of the battery with a predetermined DC load connected between the + and − terminals;
means for measuring temperature of the battery;

means for determining a battery rating of the battery based upon the measured dynamic internal resistance, the measured open circuit voltage, the measured voltage of the battery with a predetermined DC load, and the measured temperature of the battery;

means for deriving a reference voltage value as a function of the battery rating which represents a predetermined state-of-charge which is less than 100% state-of-charge;

means for deriving a temperature corrected measured voltage value under DC load conditions from the measured voltage to the battery with a predetermined DC load and the measured temperature;

means for comparing the temperature corrected measured voltage value with the reference voltage value; and means for providing an indication of battery condition based upon the comparison.

* * * * *